(12) United States Patent
Mortain et al.

(10) Patent No.: US 11,201,008 B2
(45) Date of Patent: Dec. 14, 2021

(54) ELECTRICAL ASSEMBLY COMPRISING A CAPACITIVE ELEMENT

(71) Applicant: Valeo Siemens eAutomotive France SAS, Cergy (FR)

(72) Inventors: Eloi Mortain, Surenes (FR); Alwin Moceri, Conflans Sainte-Honorine (FR)

(73) Assignee: VALEO SIEMENS EAUTOMOTIVE FRANCE SAS, Cergy (FR)

( * ) Notice: Subject to any disclaimer, the term of this patent is extended or adjusted under 35 U.S.C. 154(b) by 0 days.

(21) Appl. No.: 16/710,192

(22) Filed: Dec. 11, 2019

(65) Prior Publication Data
US 2020/0194174 A1 Jun. 18, 2020

(30) Foreign Application Priority Data

Dec. 14, 2018 (FR) ....................................... 1872984

(51) Int. Cl.
| | |
|---|---|
| *H05K 7/00* | (2006.01) |
| *H01G 2/10* | (2006.01) |
| *H01G 2/02* | (2006.01) |
| *H01G 2/08* | (2006.01) |
| *H02M 3/04* | (2006.01) |
| *H02M 7/44* | (2006.01) |
| *H05K 7/20* | (2006.01) |

(52) U.S. Cl.
CPC .............. *H01G 2/106* (2013.01); *H01G 2/02* (2013.01); *H01G 2/08* (2013.01); *H02M 3/04* (2013.01); *H02M 7/44* (2013.01); *H05K 7/20854* (2013.01)

(58) Field of Classification Search
USPC ........................................................ 361/728
See application file for complete search history.

(56) References Cited

U.S. PATENT DOCUMENTS

| | | | | |
|---|---|---|---|---|
| 8,416,580 | B2* | 4/2013 | Matsumoto | ........... G06F 1/1688 |
| | | | | 361/807 |
| 8,537,557 | B2* | 9/2013 | Li | ........................... G06F 1/186 |
| | | | | 361/730 |
| 9,781,855 | B2* | 10/2017 | Fan | .......................... H01B 7/04 |
| 2008/0265586 | A1 | 10/2008 | Like et al. | |
| 2011/0102966 | A1* | 5/2011 | Takeoka | ................... H01G 4/38 |
| | | | | 361/301.3 |
| 2017/0062134 | A1* | 3/2017 | Koyama | ................. H01G 4/228 |
| 2020/0194146 | A1* | 6/2020 | Moceri | ................ H01R 25/161 |

FOREIGN PATENT DOCUMENTS

| | | |
|---|---|---|
| KR | 101057630 B1 | 8/2011 |
| WO | 2015035799 A1 | 3/2015 |

OTHER PUBLICATIONS

French Search Report for Application No. 1872984 dated Aug. 6, 2019.

* cited by examiner

*Primary Examiner* — Hung S. Bui
(74) *Attorney, Agent, or Firm* — McCormick, Paulding & Huber PLLC

(57) ABSTRACT

The object of the invention is an electrical assembly, in particular a capacitive block, comprising a capacitive element, at least one electric connector secured to said capacitive element and a casing having a bottom, a side wall and an aperture through which the capacitive element is inserted, said casing comprising at least one shoulder on the side of the aperture, said shoulder forming a stop configured to receive in abutment said at least one electric connector, so as to support said capacitive element.

20 Claims, 3 Drawing Sheets

[Fig. 1]
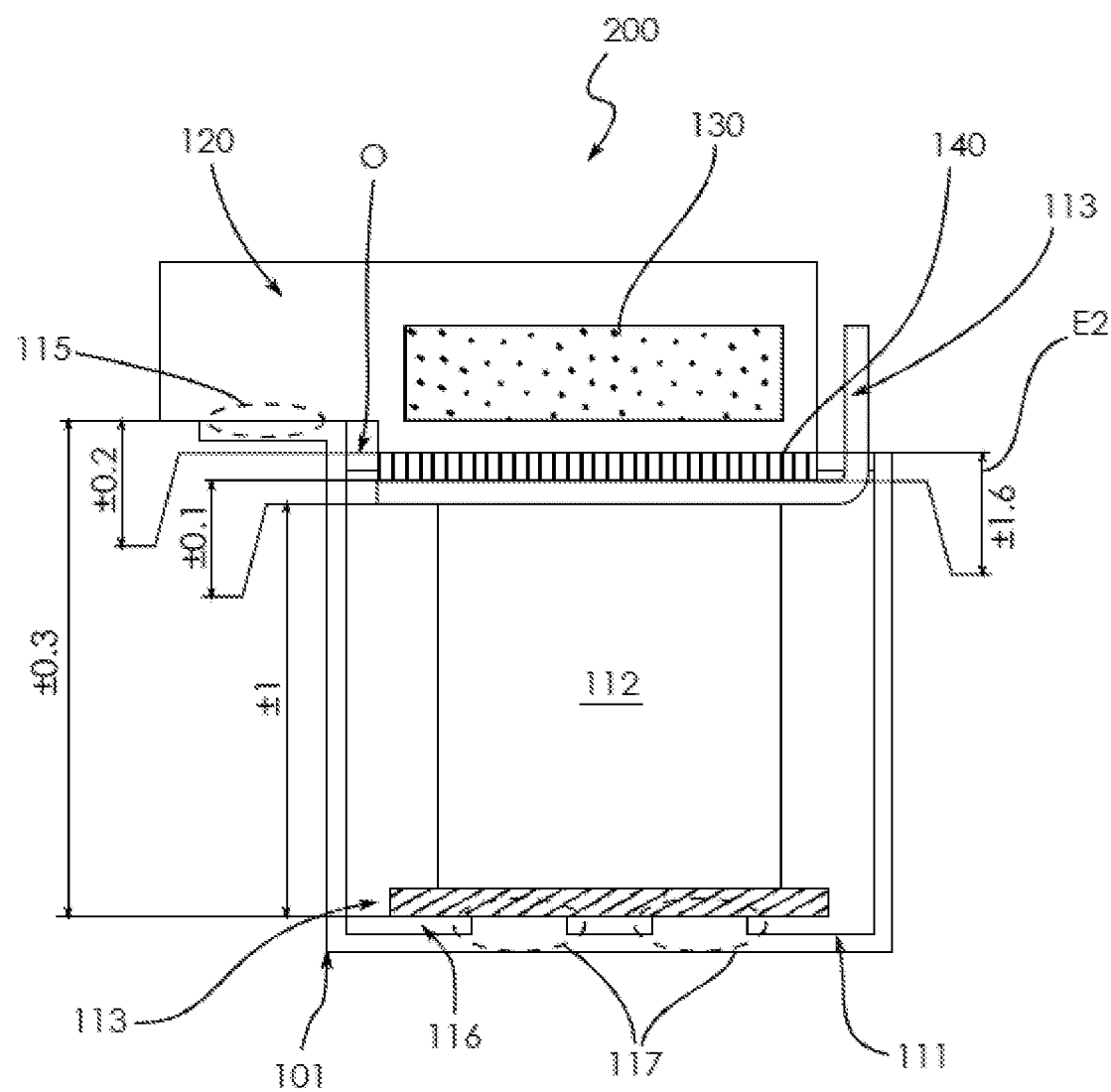

[Fig. 2]
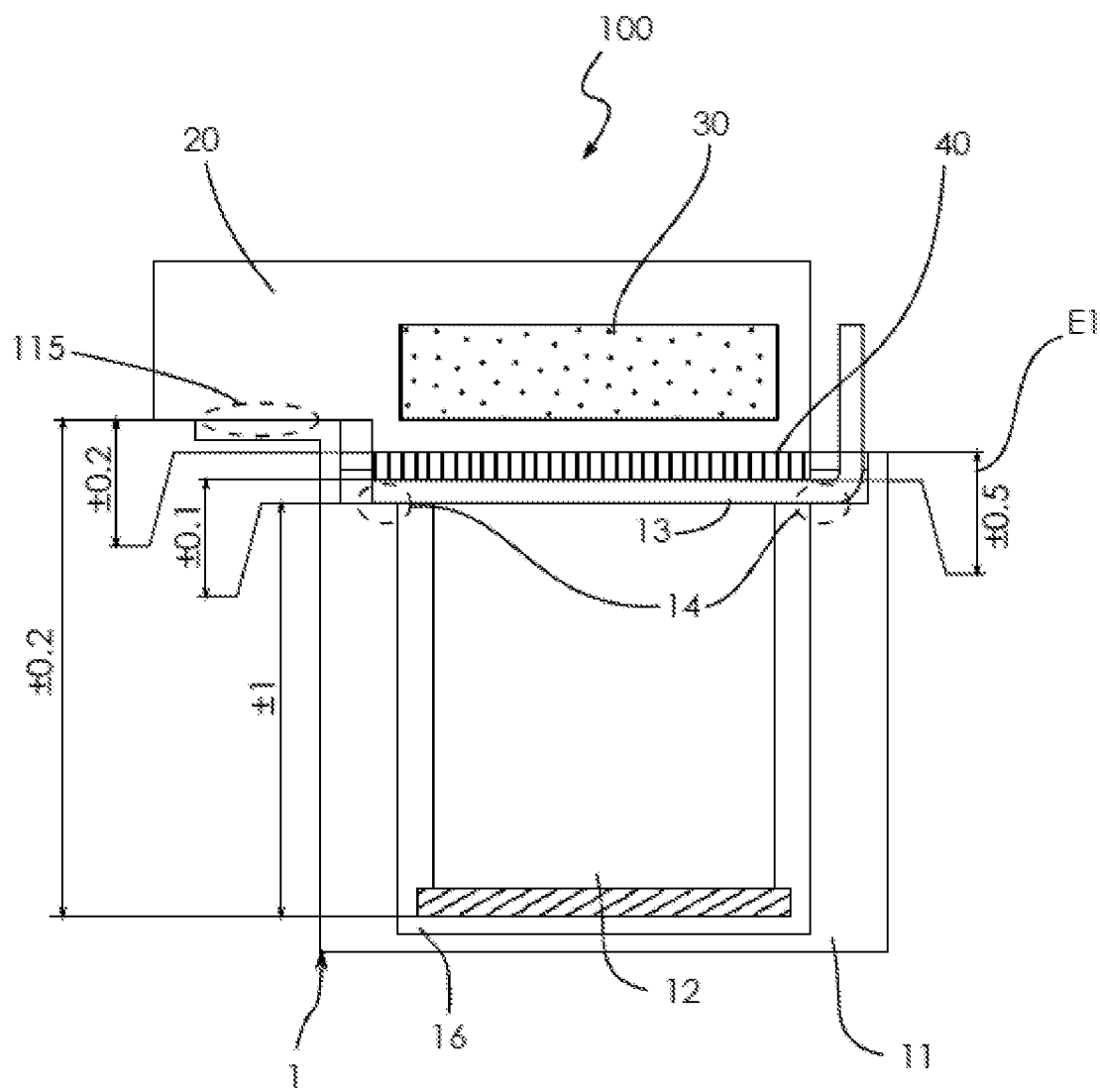

[Fig. 3]
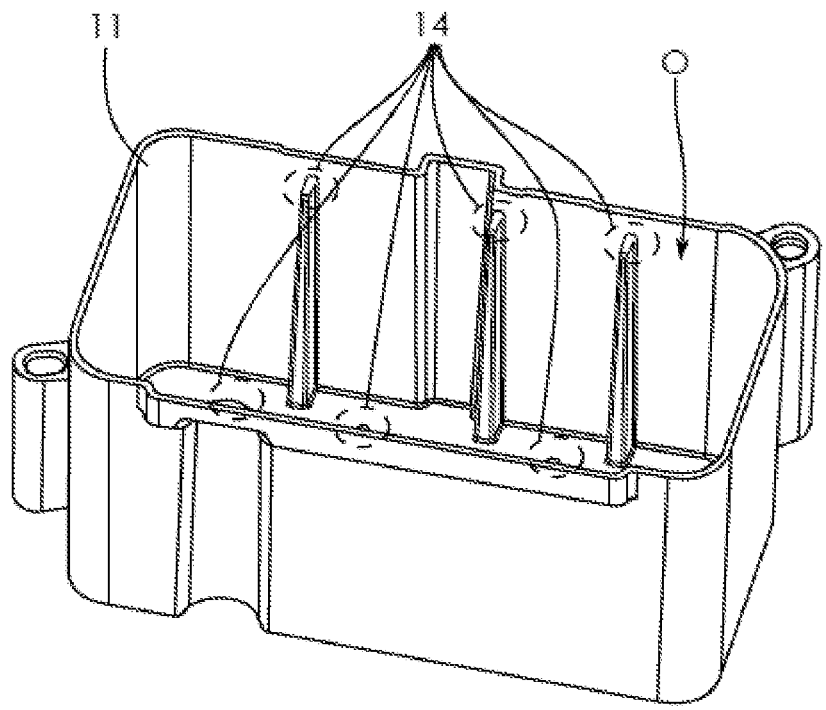
[Fig. 4]
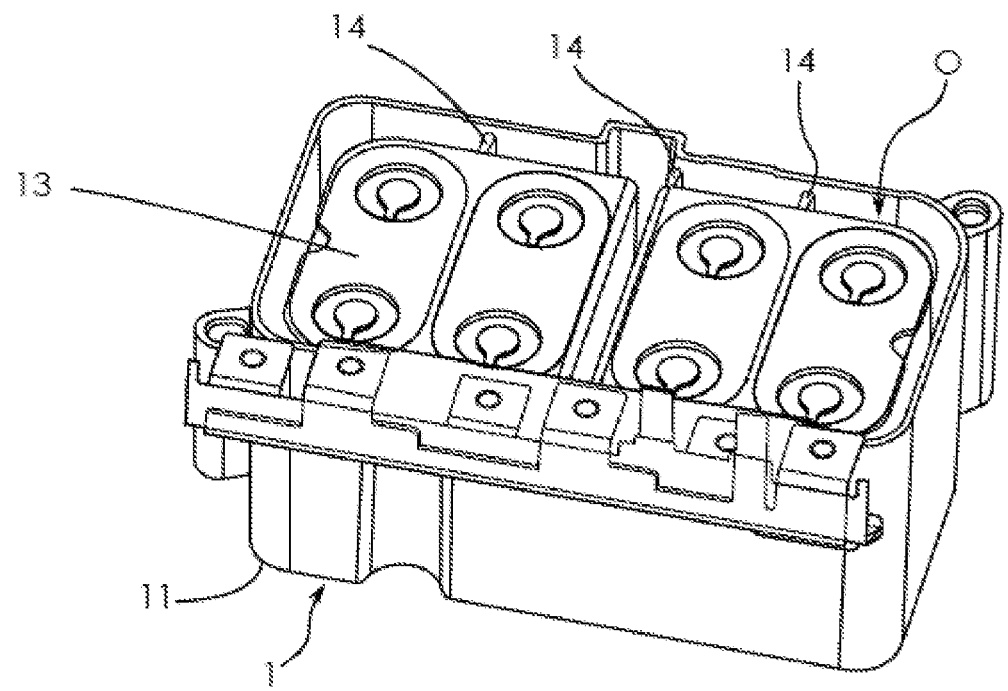

ELECTRICAL ASSEMBLY COMPRISING A CAPACITIVE ELEMENT

CROSS-REFERENCE TO RELATED APPLICATION

This application claims foreign priority benefits under 35 U.S.C. § 119 to French Patent Application No. 1872984 filed on Dec. 14, 2018, the content of which is hereby incorporated by reference in its entirety.

TECHNICAL FIELD

The present invention relates to an electrical assembly especially comprising a capacitive element and a casing and is directed in particular at a capacitive block.

The present invention especially aims at improving control of manufacturing dimensions of such an electrical assembly, in particular of a capacitive block.

One advantage of the invention is to facilitate assembling of such an electrical assembly into an electric equipment, such as an power inverter, in particular in the field of the electric motor systems for a vehicle.

The invention aims in particular at enabling assembling adapted to the mass production of such pieces of electric equipment.

BACKGROUND

As is known, in a hybrid or electric automobile vehicle, a high voltage power battery provides a function of supplying power to an electric motorisation system enabling the vehicle to be driven. In order to be charged, the high voltage power battery is for example connected to an external electrical power grid, especially via an electric charger comprising at least one DC-DC voltage converter.

In order to control the electric machine driving the wheels of the vehicle, it is known to use a power inverter enabling the current supplied by the high voltage power battery to be converted into one or more alternating, for example sinusoidal control currents.

The power inverter comprises a capacitive block enabling the current provided by the power battery to be smoothed, before being converted into alternating control currents. The capacitive block comprises a casing comprising a cavity, into which a capacitive element is inserted, especially for ensuring smoothing of the current. This capacitive element thus enables residual disturbances of the current to be removed so that this current can be converted into alternating control currents. In a capacitive block, the capacitive element is embedded in its casing in a filling material, especially a resin, providing sealing and electrical insulation of said capacitive element. The capacitive block also includes at least one output electric connector for allowing electrical connection of the capacitive element to another electric device. Said at least one electric connector is in particular welded to said capacitive element. Said electric connector corresponds to an electric conductor also referred to as a lead chassis. Such an electric connector is for example folded in order to provide said electric connection of the capacitive element with another electric device through a dedicated electric connecting bar.

The power inverter further comprises an electronic power module configured to perform conversion of the current provided by the battery into alternating control currents injected into the electric machine.

As is known, in an electric equipment, a capacitive element can be disposed in a casing and embedded in a filling material mainly providing a function of holding and protecting the capacitive element against moisture. Such a filling material is generally in the form of a resin.

Such an electric equipment comprising a capacitive element has to be cooled so as to dissipate heat emitted by the capacitive element. To do so, the electric equipment is disposed against a cooling circuit.

In practice, with reference to FIG. 1, representative of a state of the art, in such an electric device 200, the capacitive element 112 is placed into a casing 111 having a bottom, a side wall and an aperture through which the capacitive element 112 is inserted into the casing 111. The casing 111 is fitted with studs 117 provided on the bottom of the casing 111. The capacitive element 112 lies on these studs 117. On the opposite side, electric connectors 113 of the capacitive element 112 are welded to said capacitive element 112. The capacitive element 112 is to be embedded into a filling material 116 of the casing 111, in particular a resin providing sealing and electrical insulation of the capacitive element, said filling material 116 being also referred to as "potting".

This assembly 101 formed by the casing 111 and the capacitive element 112 fitted with electric connectors 113 is placed, through the side corresponding to the aperture, against a cooling circuit 130, for example integrated into a chassis 120 of an electric equipment 200 encompassing said assembly 101. To do so, the electrical assembly 101 is attached, by adapted means 115, to the chassis 120.

Thus, in the context of a conventional assembling process, the sub-assembly 101 forming a capacitive block, is for example screwed on a main chassis, in particular the chassis of an power inverter providing energy to a vehicle electric motor.

As is known, a thermal interface 140 is provided between the capacitive element 112 and the electric connectors 113, on the one hand, and the cooling circuit 130 on the other hand. Such a thermal interface 140 especially consists of materials the thermal conductivity of which is high. Its function is to improve the thermal dissipation of heat coming from the electric connectors 113 of the capacitive element 112 towards the cooling circuit 130. The thermal interface 140 is in practice a heat dissipator which is disposed in contact with the cooling circuit 130. As is also known, the thickness of this thermal interface 140 is dictated by predetermined dimension requirements, related in particular to the heat quantity to be dissipated during operation.

The state of the art does not however enable the total control of the level at which the top of the assembly 101 comprising the casing 111 and the capacitive element 112 is, especially due to the different manufacturing tolerances of each part making up the assembly, intrinsically related to the above-described assembling process, with respect to FIG. 1. More particularly, the variability relating to the height of the capacitive element 112 is high.

But, as is known, in the state of the art, the height of the thermal interface 140 is dictated by the dimensions of other elements of the electrical assembly, in particular of the capacitive block. In addition to the height of the capacitive element 112, the height of the casing 111, the one of the studs 117 on which the capacitive element 112 lies have in particular an impact.

With the manufacturing tolerances inherent to each of these elements, in practice potentially highly variable thicknesses of the thermal interface, within 1.6 mm, are obtained. This variability E2 induced on the thickness of the thermal interface 140 is a major drawback since, in particular, if the thermal interface 140 is too thin, in other words too compressed, it can be perforated, which would induce a sealing loss in the electrical assembly 101. Similarly, if the thickness of the thermal interface 140 is too high, the thermal dissipation function is less good.

But, most of the variability E2 of the thickness of the thermal interface 140, in the state of the art, comes from the height of the capacitive block, or, in other words, of the electrical assembly 101 consisting of a casing 111 and the capacitive element 112 disposed in said casing 111. In particular, the height of the capacitive element 112 has a large variability, due to the manufacturing tolerances, which leads to a large uncertainty on height and thickness of the thermal interface in particular. Thus, two capacitive elements of the same type, corresponding to an identical model, can have different heights, typically within 1 mm.

There is therefore a need for an electrical assembly comprising a capacitive element disposed into a casing configured so as to, while keeping some flexibility regarding the manufacturing dimensions and maintaining a minimum size, the height of said electrical assembly is controlled, so that the level reached by the top of the capacitive element, on the side of the aperture of the casing, is controlled.

By fulfilling this need, especially, the thickness of the thermal interfaces for being implemented between the capacitive element and its electric connectors and a cooling circuit of a chassis against which said assembly is disposed, is also controlled.

To do so, it is provided an electrical assembly consisting of a casing in which a capacitive element comprising electric connectors is disposed. According to the invention, said casing comprising a shoulder arranged on the aperture side, said shoulder receiving in abutment said at least one electric connector of the capacitive element.

SUMMARY

More precisely, the object of the invention is an electrical assembly, in particular a capacitive block, comprising a capacitive element, at least one electric connector secured to said capacitive element and a casing having a bottom, a side wall and an aperture through which the capacitive element is inserted, said casing comprising at least one shoulder on the aperture side, said shoulder forming a stop configured to receive in abutment said at least one electric connector, so as to support said capacitive element.

Advantageously, the capacitive element is embedded in a filling material of the casing, in order to attach the capacitive element in said casing.

According to one embodiment, the shoulders are ribs forming longitudinal protrusions integral with the casing, said ribs having an end, recessed from the aperture, forming said stop configured to receive in abutment said at least one electric connector.

According to one embodiment, the at least one electric connector has a thickness lower than the distance between the shoulder and the aperture.

According to one embodiment, the casing comprises a cavity able to house the whole capacitive element.

The present invention is also directed to an electric equipment comprising a cooling circuit and an electrical assembly such as briefly described above, said electrical assembly being mounted on the cooling circuit of the electric equipment in particular through the aperture of the casing.

According to one embodiment, said electric equipment is configured to be on board a vehicle, and forms an power inverter configured so as to supply an electric motor driving the vehicle from a battery, or a DC-DC converter configured to convert a voltage between a high voltage power battery and a low voltage power battery, or an electric charger configured to convert a voltage between an electric power grid external to the vehicle and a battery of the vehicle.

The invention is also directed to a manufacturing method of an assembly such as briefly described above, comprising the steps of:
  attaching at least one electric connector on at least one terminal of the capacitive element,
  positioning the capacitive element fitted with the connector into the casing, said connector coming in abutment against the shoulder,
  filling the casing with a fluid filling material so as to fill in at least partly, or even totally, the space between the capacitive element and the casing,
  curing the filling material, in particular through heating, so as to attach the capacitive element in the casing.

Advantageously, said at least one electric connector is welded to the capacitive element, on the aperture side of the casing.

BRIEF DESCRIPTION OF THE DRAWINGS

The invention will be better understood upon reading the following description, with reference to the appended drawings given by way of non-limiting examples, in which identical references are given to similar objects and in which:

FIG. 1 (already described) is a scheme of an equipment comprising an electrical assembly including a casing and a capacitive element, with an electric interface provided between said assembly and a chassis comprising a cooling circuit;

FIG. 2 is a scheme of a corresponding electrical assembly, according to one example of the invention;

FIG. 3 represents a perspective view of a casing of an electrical assembly according to one example of the invention; and FIG. 4 shows a perspective view of an electrical assembly according to one example of the invention.

It should be noted that the figures set out the invention in further detail to implement the invention, wherein said figures can of course be used to better define the invention if necessary.

DETAILED DESCRIPTION

In the description that will be made below, the invention will be mainly described for an implementation in a capacitive block, or at least in an electric equipment comprising a capacitive element disposed in a casing, especially in the context of an electric equipment for a vehicle, in particular an electric or hybrid automobile vehicle, without this being restrictive of the scope of the present invention.

The present invention also relates to an electric equipment comprising a casing at least one partially wrapping a capacitive element. A particular application relates to a capacitive block such as above-described, without this application being considered as a restriction.

The capacitive block also comprises at least two connectors, in particular a connector corresponding to the negative terminal of the capacitive element and a connector corresponding to the positive terminal of the capacitive element. These connectors thus enable an access to the negative and positive terminals of the capacitor, in order to connect the capacitive element to the rest of the system.

Other pieces of electric equipment, especially for an electric or hybrid vehicle, such as a DC-DC voltage converter or an electric charger, can also include such types of capacitive blocks.

FIG. 1 shows an electric equipment 200 of prior art in a two dimension sectional, side schematic view. The electric equipment 200 has already been previously described.

With reference to FIG. 2, the capacitive element 12, instead of being laid at the bottom of the casing 11, on studs, comes in abutment on the top of the casing 11. The filling material 16 ensures holding of the capacitive element 12. Furthermore, the filling material 16 enables the capacitive element 12 to be electrically insulated and said capacitive element 12 to be sealed. This way, the electric equipment 100 has, between the electrical assembly 1 forming a capacitive block and the cooling circuit 20 which can be integrated into a chassis and comprises a cooling block 30, a thermal interface 40 with a controlled thickness. The thermal interface 40 especially consists of a flexible material providing a high thermal conductivity, for example of the Gap Pad® type. Alternatively, the thermal interface 40 can consist of a thermal grease.

According to one example of the invention, still with reference to FIG. 2, a stop is made in contact with at least one electric connector 13 welded to the capacitive element 12, on the "top" of said coil 12, that is on the side of the aperture of the casing 11, and at least one a shoulder 14 provided on "top" of the casing 11, that is on the side of the aperture O of said casing 11.

The dimension tolerance, related to the manufacture, in particular affecting the height of the thermal interface between said at least one electric connector 13 of the capacitive element 12 and a cooling circuit 20, therefore only depends on the thickness of said at least one connector 13 and on the height of the shoulder 14, that is on the distance between the shoulder 14 and the aperture O.

The stop being provided on top of the casing 11, the casing 11 can also be a casing 11 in which the whole capacitive element 12 is housed.

By virtue of the abutment of the connector 13 on the at least one shoulder 14, the capacitive element 12 is supported by said at least one shoulder 14 and not by the bottom of the casing 11 as is the case in prior art. A space remains between the lower end part of the capacitive element 12, that is opposite the aperture O of the casing 11, and the bottom of the casing 11. Thus, this space can accommodate an uncertainty regarding the height of the capacitive element 12 and therefore makes it possible to have a top of a capacitive block 12 which remains at an identical level whatever the variation in the height of the capacitive element 12 with respect to a reference nominal height.

According to one embodiment, the casing consists of an electrically conducting material, for example of aluminum. In this case, an electrically insulating sheet can be additionally disposed, between, on the one hand, the capacitive element 12 and the at least one electric connector 13 it comprises and on the other hand said casing. For example, the electrical assembly is thereby part of an electric equipment such as an power inverter and the casing is a cover of the power inverter.

In one embodiment, the casing 11 is made of plastics and it is not necessary to provide an additional electrically insulating sheet.

In FIGS. 3 and 4, a casing 11 of an electrical assembly according to one example of the invention and such an electrical assembly 1, in which a capacitive element 12 is housed in the casing 11, at least one electric connector 13 welded to the top of the capacitive element 12, that is on the side of the aperture of the casing 11, lies on shoulders 14 provided on top of the casing 11, are respectively represented.

As shown in the figures, by virtue the invention, with a manufacturing iso-tolerance of the mechanical parts, the variability E1 potentially dictated on the thickness of the thermal interface 40 is reduced to +/−0.5 mm versus +/−1.6 mm in the case of FIG. 1, representative of the state of the art.

As represented in FIGS. 3 and 4, the shoulders 14 are for example ribs forming longitudinal protrusions in the casing 11. The capacitive element 12 is provided to be inserted into the cavity of the casing 11. The electric connectors 13 welded to said capacitive element 12 lie in abutment on the shoulders 14. In particular, the capacitive element 12 is subsequently embedded into a filling material, especially a resin, which occupies the entire volume available in the casing 11. By rigidifying, this filling material holds the capacitive element 12 in place in the casing 11. According to one embodiment, the filling material does not encompass the whole capacitive element, but only covers part of it, which is sufficient to ensure to hold it.

The electrical assembly 1 thus constituted can then be disposed against a cooling circuit for example. In particular, with reference to FIG. 2, the electrical assembly 1 is configured to be disposed against a chassis comprising a cooling circuit 20. A thermal interface 40, providing a function of improving heat dissipation, is especially interposed between the electric connectors 13 of the capacitive element 12 and said cooling circuit 20.

Since the electrical assembly 1 is provided to be attached to said cooling circuit 20 by adapted means 15, said electrical assembly 1 and said cooling circuit 20 being contacted to each other, said contact being of the plane-plane type, the thickness of the thermal interface 40 is stressed. By virtue of the invention, the thickness of the thermal interface 40 is however controlled with an improved accuracy with respect to the state of the art, said thickness of the thermal interface 40 being only affected by the manufacturing tolerances related to the height of the shoulders 14 and to the thickness of the electric connectors 13 of the capacitive element 12.

Especially, the uncertainty relative to the manufacturing tolerances related to the height of the capacitive element 12 no longer affects said thickness of the thermal interface 40. Furthermore, no stud is necessary at the bottom of the casing 11 to receive the capacitive element 12.

According to one embodiment, the electrical assembly can be disposed on a cover of the chassis, using especially guide studs provided on said cover, and form with said cover an assembly, and then can be assembled on the chassis especially comprising a cooling circuit. In this case, said cover corresponds to the "casing" of the electrical assembly, said cover partially or totally wrapping the capacitive element.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. An electrical assembly comprising a capacitive element, at least one electric connector secured to said capacitive element and a casing having a bottom, a side wall and an aperture through which the capacitive element is inserted, said casing comprising at least one shoulder on the side of the aperture, said shoulder forming a stop configured to receive in abutment said at least one electric connector, so as to support said capacitive element.

2. The electrical assembly according to claim 1, the capacitive element being embedded in a filling material of the casing, to attach the capacitive element in said casing.

3. The electrical assembly according to claim 2, wherein the shoulders are ribs forming longitudinal protrusions integral with the casing, said ribs having an end, recessed from the aperture, forming said stop configured to receive in abutment said at least one electric connector.

4. The electrical assembly according to claim 2, wherein the at least one electric connector has a thickness lower than the distance between the shoulder and the aperture.

5. The electrical assembly according to claim 2, the casing having a cavity able to house the whole capacitive element.

6. The electrical assembly according to claim 1, wherein the shoulders are ribs forming longitudinal protrusions integral with the casing, said ribs having an end, recessed from the aperture, forming said stop configured to receive in abutment said at least one electric connector.

7. The electrical assembly according to claim 6, wherein the at least one electric connector has a thickness lower than the distance between the shoulder and the aperture.

8. The electrical assembly according to claim 6, the casing having a cavity able to house the whole capacitive element.

9. The electrical assembly according to claim 1, wherein the at least one electric connector has a thickness lower than the distance between the shoulder and the aperture.

10. The electrical assembly according to claim 9, the casing having a cavity able to house the whole capacitive element.

11. The electrical assembly according to claim 1, the casing having a cavity able to house the whole capacitive element.

12. An electric equipment comprising a cooling circuit and an electrical assembly according to claim 1, said electrical assembly being mounted on the cooling circuit of the electric equipment in particular through the aperture of the casing.

13. The electric equipment according to claim 12, configured to be onboard a vehicle, and forming an power inverter configured so as to supply an electric motor driving the vehicle from a battery, or a DC-DC converter configured to convert a voltage between a high voltage power battery and a low voltage power battery, or an electric charger configured to convert a voltage between an electrical power grid external to the vehicle and a battery of the vehicle.

14. The electric equipment according to claim 12, further comprising the capacitive element being embedded in a filling material of the casing, to attach the capacitive element in said casing.

15. The electric equipment according to claim 12, wherein the shoulders are ribs forming longitudinal protrusions integral with the casing, said ribs having an end, recessed from the aperture, forming said stop configured to receive in abutment said at least one electric connector.

16. The electric equipment according to claim 12, wherein the at least one electric connector has a thickness lower than the distance between the shoulder and the aperture.

17. The electric equipment according to claim 12, further comprising the casing having a cavity able to house the whole capacitive element.

18. A method for manufacturing an electrical assembly comprising a capacitive element, at least one electric connector secured to said capacitive element and a casing having a bottom, a side wall and an aperture through which the capacitive element is inserted, said casing comprising at least one shoulder on the side of the aperture, said shoulder forming a stop configured to receive in abutment said at least one electric connector, so as to support said capacitive element, the method comprising the steps of:
    attaching the at least one electric connector on at least one terminal of the capacitive element,
    positioning the capacitive element fitted with the connector in the casing, said connector coming in abutment against the shoulder,
    filling the casing with a fluid filling material so as to fill in at least partly, or even totally, the space between the capacitive element and the casing, and
    curing the filling material, in particular through heating, so as to attach the capacitive element in the casing.

19. The method according to claim 18, further comprising the capacitive element being embedded in a filling material of the casing, to attach the capacitive element in said casing.

20. The method according to claim 18, wherein the shoulders are ribs forming longitudinal protrusions integral with the casing, said ribs having an end, recessed from the aperture, forming said stop configured to receive in abutment said at least one electric connector.

* * * * *